US008786070B2

(12) United States Patent
Sato et al.

(10) Patent No.: US 8,786,070 B2
(45) Date of Patent: Jul. 22, 2014

(54) MICROELECTRONIC PACKAGE WITH STACKED MICROELECTRONIC ELEMENTS AND METHOD FOR MANUFACTURE THEREOF

(71) Applicant: Tessera, Inc., San Jose, CA (US)

(72) Inventors: Hiroaki Sato, Yokohama (JP); Norihito Masuda, Kanagawa (JP); Belgacem Haba, Saratoga, CA (US); Ilyas Mohammed, Santa Clara, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/940,582

(22) Filed: Jul. 12, 2013

(65) Prior Publication Data
US 2013/0300000 A1    Nov. 14, 2013

Related U.S. Application Data

(63) Continuation of application No. 13/195,187, filed on Aug. 1, 2011, now Pat. No. 8,487,421.

(51) Int. Cl.
H01L 23/02 (2006.01)
(52) U.S. Cl.
USPC .......... 257/686; 257/777; 257/E25.005; 257/E25.021; 257/E25.027; 257/E23.085
(58) Field of Classification Search
USPC .......... 257/686, 693, 777, E25.006, E25.021, 257/E25.027, E23.085
See application file for complete search history.

(56) References Cited

U.S. PATENT DOCUMENTS

| 5,455,390 A | 10/1995 | DiStefano et al. |
| 7,391,121 B2 | 6/2008 | Otremba |
| 7,514,786 B2 | 4/2009 | Hsu |
| 8,035,217 B2 | 10/2011 | Mori et al. |
| 8,487,421 B2 * | 7/2013 | Sato et al. .................. 257/686 |
| 2005/0230835 A1 | 10/2005 | Sunohara et al. |
| 2007/0052086 A1 | 3/2007 | Oi et al. |
| 2010/0252935 A1 | 10/2010 | Lee et al. |

FOREIGN PATENT DOCUMENTS

| KR | 2001-0094894 A | 11/2001 |
| WO | 2009/020572 A2 | 2/2009 |

* cited by examiner

Primary Examiner — Jasmine Clark
(74) Attorney, Agent, or Firm — Lerner, David, Littenberg, Krumholz & Mentlik, LLP

(57) ABSTRACT

A microelectronic package may include a stacked microelectronic unit including at least first and second vertically stacked microelectronic elements each having a front face facing a top surface of the package. The front face of the first element may be adjacent the top surface, and the first element may overlie the front face of the second element such that at least a portion of the front face of the second element having an element contact thereon extends beyond an edge of the first element. A conductive structure may electrically connect a first terminal at the top surface to an element contact at the front face of the second element, and include a continuous monolithic metal feature extending along the top surface and through at least a portion of an encapsulant, which is between the top surface and the front face of the second element, towards the element contact.

4 Claims, 14 Drawing Sheets

MICROELECTRONIC PACKAGE WITH STACKED MICROELECTRONIC ELEMENTS AND METHOD FOR MANUFACTURE THEREOF

CROSS-REFERENCE TO RELATED APPLICATIONS

The present application claims the benefit of U.S. patent application Ser. No. 13/195,187, filed on Aug. 1, 2011, now U.S. Pat. No. 8,487,421, the disclosure of which is incorporated herein by reference.

BACKGROUND

The subject matter of the present application relates to a microelectronic package including stacked microelectronic elements, and to methods of fabricating the package.

Microelectronic elements, such as semiconductor chips, are flat bodies with contacts disposed on the front surface that are connected to the internal electrical circuitry of the element itself. Microelectronic elements are typically packaged, optionally with substrates, to form microelectronic packages having terminals that are electrically connected to the element's contacts. The terminals of the package may then be connected to an external microelectronic component, such as a circuit panel.

It is desirable to package plural chips in a "stack" arrangement, i.e., where plural chips are placed one on top of another, to save space. In a stacked arrangement, several chips can be mounted to occupy a surface area, such as of a substrate, that is less than the total surface area of all the stacked chips. The reduced area of the stacked chips can result in very efficient utilization of area on a printed circuit board ("PCB") to which the stacked chips can eventually be attached.

Further improvements are desirable in the art of producing multi-chip packages that can be connected with a microelectronic component external to the packages.

SUMMARY

In accordance with one embodiment, a microelectronic package having a top surface and a bottom surface remote from the top surface may include a stacked microelectronic unit. The stacked unit may include at least first and second vertically stacked microelectronic elements each having a front face facing the top surface and a rear face remote from the front face. The front face of the first microelectronic element may be adjacent the top surface, and the first microelectronic element overlies the front face of the second microelectronic element such that at least a portion of the front face of the second microelectronic element having at least one element contact thereon extends beyond an edge of the first microelectronic element. The package may include an encapsulant between the top surface and the front face of the second microelectronic element. Also, the package may include at least one first package terminal at the top surface, where the first terminal is usable to connect the package to a contact of a first microelectronic component external to the package. Further, the package may include a conductive structure electrically connecting the first terminal to at least one element contact at the front face of the second microelectronic element, where the conductive structure includes a continuous monolithic metal feature extending along the top surface and through at least a portion of the encapsulant towards the at least one element contact.

In another embodiment, a microelectronic package having a top surface and a bottom surface remote from the top surface may include a stacked microelectronic unit. The stacked unit may include at least first and second vertically stacked microelectronic elements each having a front face facing the top surface and a rear face remote from the front face. The front face of the first microelectronic element may be adjacent the top surface. The first microelectronic element may overlie the front face of the second microelectronic element such that at least a portion of the front face of the second microelectronic element having at least one element contact thereon extends beyond an edge of the first microelectronic element. The package may include an encapsulant between the top surface and the front face of the second microelectronic element. In addition, the package may include at least one package terminal at the top surface, where the terminal is usable to connect the package to a contact of a microelectronic element external to the package. Further, the package may include a conductive structure electrically connecting the terminal to at least one element contact at the front face of the second microelectronic element, where the conductive structure includes a wire bond extending from the at least one element contact, through the encapsulant and to the top surface and a conductive trace contacting the wire bond and extending along the top surface away from the wire bond.

In another embodiment, a microelectronic package having a top surface and a bottom surface remote from the top surface may include a stacked microelectronic unit. The stacked unit may include at least first and second vertically stacked microelectronic elements each having a front face facing the top surface and a rear face remote from the front face. The rear face of the second microelectronic element may be adjacent the bottom surface, and the first microelectronic element may overlie the front face of the second microelectronic element such that at least a portion of the front face of the second microelectronic element having at least one element contact thereon extends beyond an edge of the first microelectronic element. The package may include a substrate having a first surface and a second surface, where the stacked unit overlies the first surface of the substrate such that at least a portion of the first surface having at least one substrate contact thereon extends beyond an edge of the stacked microelectronic unit. In addition, the package may include an encapsulant covering at least a portion of the stacked unit and the first surface of the substrate, at least one first package terminal at the top surface and electrically connected to the substrate contact, and at least one second package terminal at the second surface of the substrate and electrically connected to the substrate contact. The package may further include a conductive structure electrically connecting the first terminal with the substrate contact and at least one of an element contact at the front face of the first microelectronic element or an element contact at the front face of the second microelectronic element, where the conductive structure includes a continuous monolithic metal feature extending through the encapsulant towards the at least one element contact and the substrate contact.

In another embodiment, a method of fabricating a microelectronic package may include providing a stacked microelectronic unit including at least first and second vertically stacked microelectronic elements each having a front face and a rear face remote from the front face, where the front face of the first microelectronic element is attached to a carrier element, and where the front face of the second microelectronic element overlies the rear face of the first microelectronic element such that at least a portion of the front face of the second microelectronic element having at least one element contact thereon extends beyond an edge of the first microelectronic element. The method may include forming an encapsulant between the carrier element and the front face of the second microelectronic element, and forming at least one first package terminal overlying the front surface of the first microelectronic element or a portion of the encapsulant beyond the front surface of the first microelectronic element. The method may further include forming a conductive structure extending through the encapsulant electrically connecting the at least one first package terminal to at least one element contact at the front face of the second microelectronic element, where the at least one first terminal is exposed at a top surface of the package.

DETAILED DESCRIPTION

A microelectronic package 10 including microelectronic elements 12, such as semiconductor chips, vertically stacked one on top of another in a stacked microelectronic unit 14 may be fabricated in accordance with an embodiment of the disclosure, as shown in FIGS. 1-5. Each chip may embody a plurality of active devices (e.g., transistors, diodes, etc.), a plurality of passive devices (e.g., resistors, capacitors, inductors, etc.), or both active devices and passive devices. Typically, at least one chip embodies active devices or both active and passive devices. Each chip may be same type as the other chips in the stacked unit, or the chips may be of different types.

In a particular embodiment, one or more of the chips can be configured to have a predominant function as a logic chip, e.g., a programmable general or special purpose processor, a microcontroller, a field programmable gate array ("FPGA") device, an application specific integrated circuit ("ASIC"), a digital signal processor, among others. In such embodiment, one or more other chips in the package 10 may be configured to have a predominant function other than as a logic chip. For example, one or more logic chips may be combined with one or more storage array chips having predominant memory function in a "system in a package" ("SIP") configuration. Such memory storage array chip may include a volatile memory storage area, e.g., dynamic random access memory ("DRAM"), static random access memory ("SRAM"), a nonvolatile memory storage array such as flash memory or magnetic random access memory ("MRAM"), or a combination of volatile and nonvolatile storage arrays. In a particular embodiment, a "system on a chip" ("SOC") which combines logic function and substantial other function, e.g., substantial memory function, on the same chip, may be combined with one or more additional chips in the microelectronic package 10.

Figure 1:
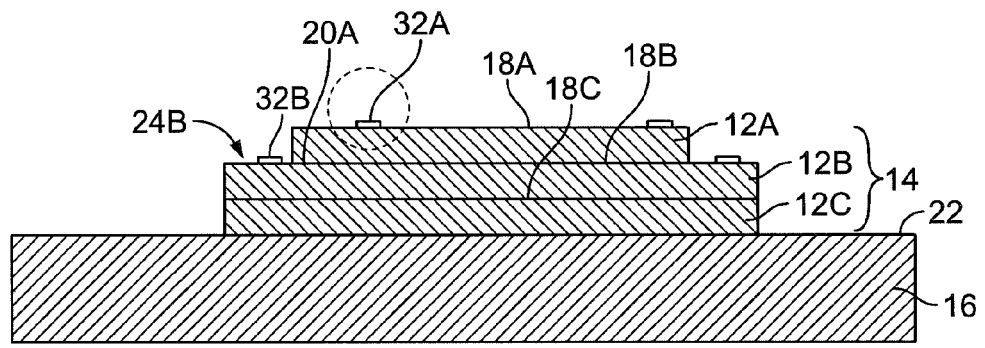
FIGS. 1-5 are diagrammatic sectional views illustrating stages in a method of fabricating a microelectronic package including vertically stacked microelectronic elements, in accordance with one embodiment of the disclosure.

Referring to FIG. 1, the stacked microelectronic unit 14 may include vertically stacked chips 12A, 12B and 12C mounted to a carrier plate 16. Each of the chips 12 may have a front surface 18 and a rear surface face 20 opposite the front surface 18. The stacked unit 14 may be formed with the front surface of one chip facing the rear surface of another chip, where the chips 12A, 12B and 12C are stacked vertically in sequence and the rear surface 20C of the chip 12C is mounted to a surface 22 of the carrier plate 16. The carrier plate 16 may be formed from dielectric material or glass.

As used in this disclosure, terms such as "upwardly," "downwardly," "vertically" and "horizontally" should be understood as referring to the frame of reference of the element specified and need not conform to the normal gravitational frame of reference. Also, for ease of reference, directions are stated in this disclosure with reference to a "front" or "top" surface of the stacked microelectronic unit 14 or a microelectronic package including a stacked microelectronic unit, such as the surface 18A of the chip 12A as shown in FIG. 1. Generally, directions referred to as "upward" or "rising from" shall refer to the direction orthogonal and away from the front surface of the stacked unit 14. Directions referred to as "downward" shall refer to the directions orthogonal to the front surface of the stacked unit and opposite the upward direction. A "vertical" direction shall refer to a direction orthogonal to a front surface of the stacked unit. The term "above" a reference point shall refer to a point upward of the reference point, and the term "below" a reference point shall refer to a point downward of the reference point. The "top" of any individual element shall refer to the point or points of that element which extend furthest in the upward direction, and the term "bottom" of any element shall refer to the point or points of that element which extend furthest in the downward direction.

Figure 6A:
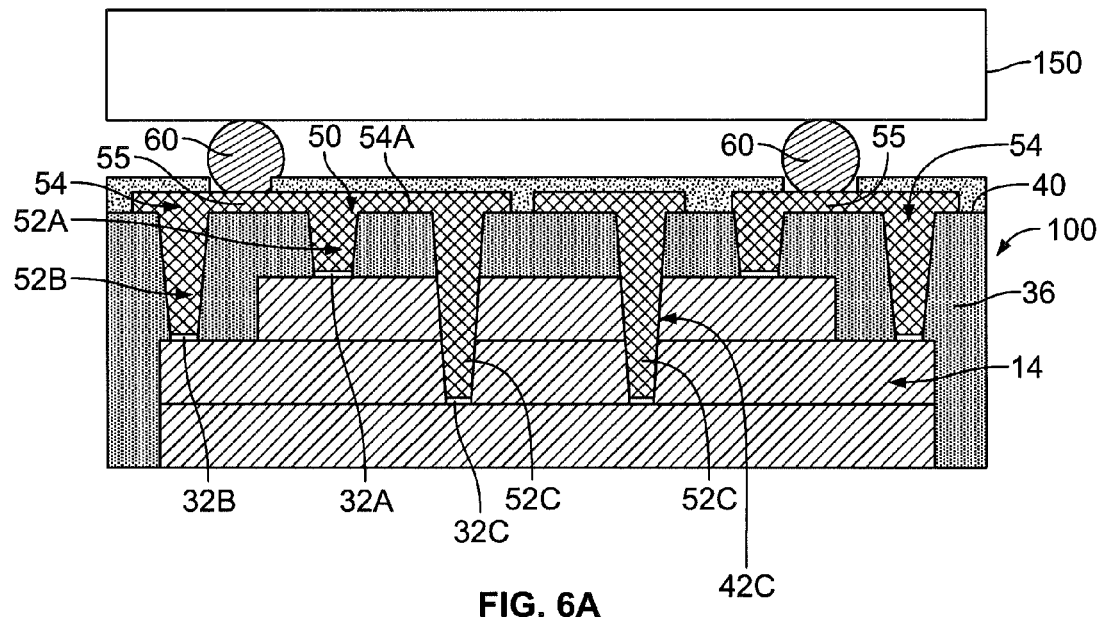
FIG. 6A is a diagrammatic sectional view of a microelectronic package formed using the method of FIGS. 1-5, in accordance with one embodiment of the disclosure.
Figure 6B:
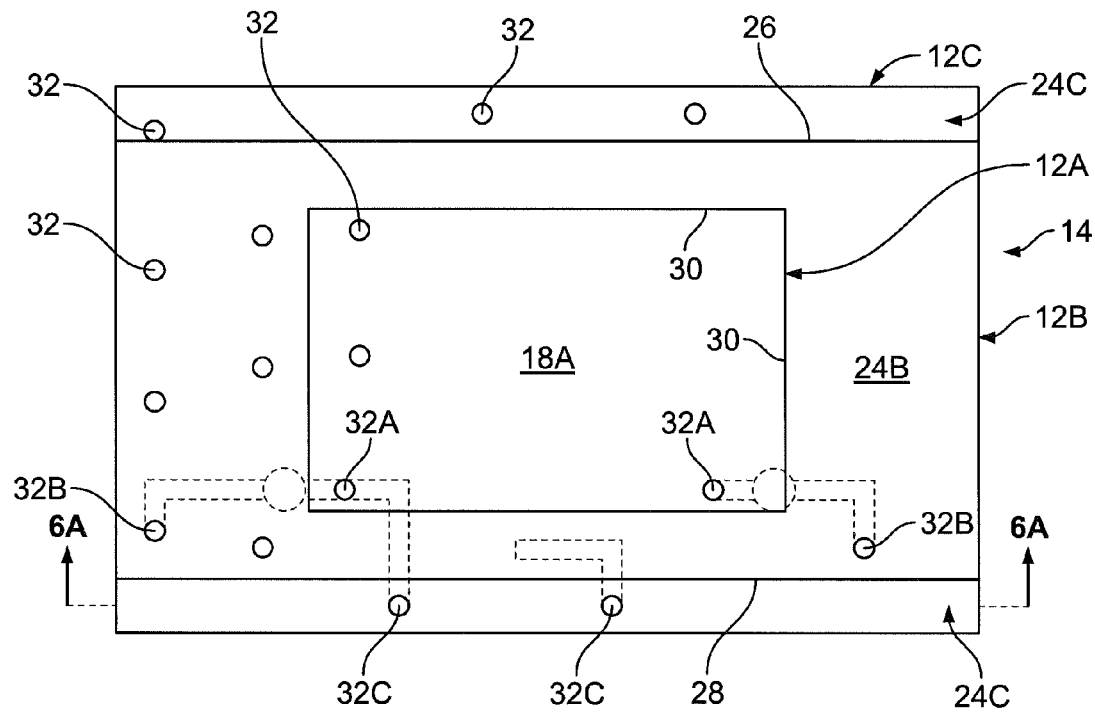
FIG. 6B is a top, plan view of an exemplary stacked microelectronic unit of the package of FIG. 6A.

Referring also to FIG. 6B, which is a top plan view of the stacked unit 14 that includes dashed lines to indicate the location of conductive elements disposed at a top surface of the package 10 in relation to elements at the front surfaces of the chips 12, the chip 12B may overlie the front surface 18C of the chip 12C, except for portions 24C of the front surface 18C that extend beyond opposing edges 26 and 28 of the chip 12B. The chip 12A may overlie the front surface 18B of the chip 12B, except for a portion 24B of the front surface 18B which extends beyond perimeter edge 30 of the chip 12A.

The chips may be attached at their facing surfaces by a layer of adhesive (not shown), and the chip 12C may be attached to the surface 22 of the plate 16 also by a layer of adhesive (not shown). The adhesive layer may include a die attach adhesive, and be selected for properties of compliancy, thermally conductivity, impermeability to moisture or other contaminant, or a combination of such properties. The adhesive layer, for example, may be a flowable adhesive or tacky (partially cured) adhesive applied to overlie the front or back surfaces of the chips 12 or the front surface of the carrier plate, after which chips are attached to the adhesive layer, such as using a pick-and-place tool. Alternatively, the adhesive layer may be deposited as a liquid onto a peelable backing or attached as a partially cured adhesive layer to a peelable backing, after which the chip 12 is attached to the adhesive layer. After removing the peelable backing, the adhesive layer can then be aligned and joined with another chip or the carrier plate 16.

Element or chip contacts 32 electrically connected to circuitry or other conductive elements (not shown) within the chips 12 may be exposed at the front surfaces 18 of the chips, and desirably at the portions 24B and 24C of the chips 12B and 12C, respectively, of the stacked unit 14.

As used in this disclosure, an electrically conductive feature can be considered "exposed at" a surface, such as at a surface of a dielectric layer that forms a top surface of a semiconductor chip, if the metallic feature is accessible to a contact or bonding material applied to such surface. Thus, a metallic feature which projects from the surface of the dielectric or which is flush with the surface of the dielectric is exposed at such surface; whereas a recessed conductive feature disposed in or aligned with a hole in the dielectric extending to the surface of the dielectric is also exposed at such surface.

The contacts 32, such as on a semiconductor chip, may include aluminum or copper, and have an exposed front surface with submicron dimensions. The front surface of the contact 32 may be covered with a metal or other electrically conductive material that protects the contact from damage during subsequent processing, such as may occur during lasing of dielectric material overlying the front surface of the chip as described below, while providing that the contact may be electrically connected to other electrically conductive material or elements of the package through the conductive material covering the contact.

Figure 18A:
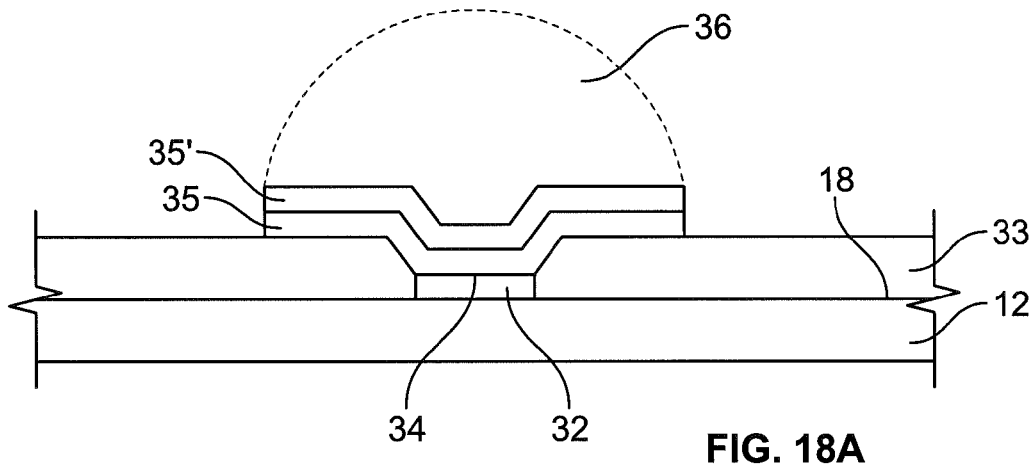
FIGS. 18A-18D are diagrammatic sectional views illustrating exemplary contacts at a surface of a microelectronic element.

Referring to FIG. 18A, a layer of dielectric material 33, e.g., a dielectric passivation layer may cover the front surface 18 of the chip 12, except for a front surface 34 of the contact 32 on which a metal underbump metallization ("UBM") structure 35 can be provided. The UBM structure 35 may be formed at the contact 32, for example, by photolithographic patterning or like techniques, to cover the front surface 34 and a portion of the front surface of the layer 33 adjacent the contact 32. The UBM structure 35 may have one or more individual layers of metal, be formed from nickel, gold, copper, or a combination of nickel and copper or nickel and gold or other metal, and may extend in directions parallel to the front surface of the chip, such as above a dielectric passivation layer 33. In one embodiment, a mass 36 of conductive material, such as solder or gold, may be provided on exposed front surface portions of the metal layer 35.

Figure 18B:
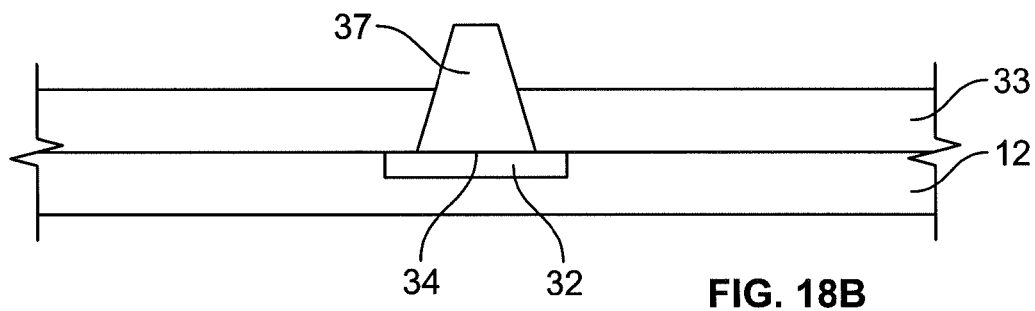

Referring to FIG. 18B, in an alternative embodiment, a post or like-shaped structure 37 including electrically conductive material, such as copper, may cover the front surface 34 and extend through the layer 33 from the front surface 34 of the contact 32. In one embodiment, the post may be made of solid copper or copper alloy and can be formed by additive, e.g., deposition, or subtractive, e.g., etching, milling or the like, processing, or a combination of additive and subtractive processing.

Figure 18C:
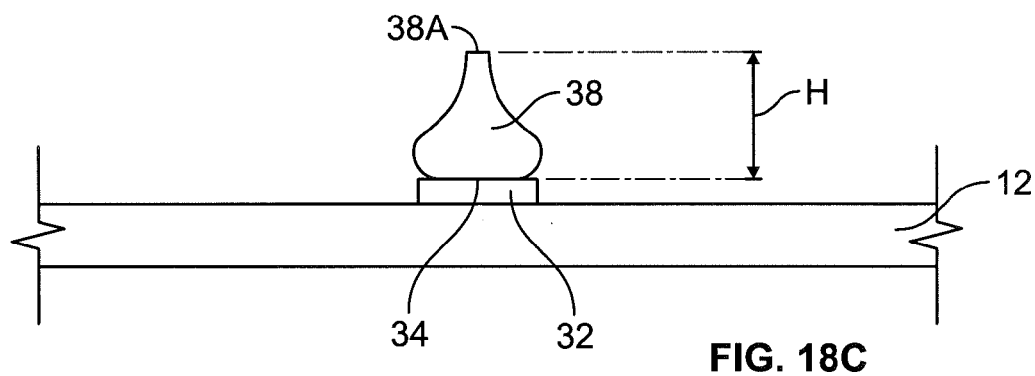

Referring to FIG. 18C, in another embodiment, a bump or stud 38 may cover the front surface 34 and extend upwardly from the front surface 34. The stud 38 may be formed, for example, by depositing a metal or other electrically conductive material on the front surface 34 using a bonding tool or the like. For example, in a particular embodiment, a metal stud bump can be made by heating the tip of a wire (usually gold or copper) extending from a capillary of a wire bonding tool to a point that the metal melts and forms a metal ball, after which the wire bonding tool clips the wire end and may shape the metal bump before moving to the next site. The stud bump 38 may have a vertical height H such that a top surface 38A can extend upwardly to adjacent a top surface of the package during a package fabrication step in which dielectric material is applied to encapsulate the stacked unit as described below. Alternatively, a conductive bump structure may be formed by printing, e.g., screen printing, stenciling, dispensing, inkjet printing, etc., transfer printing, or molding the bump in place.

Figure 18D:
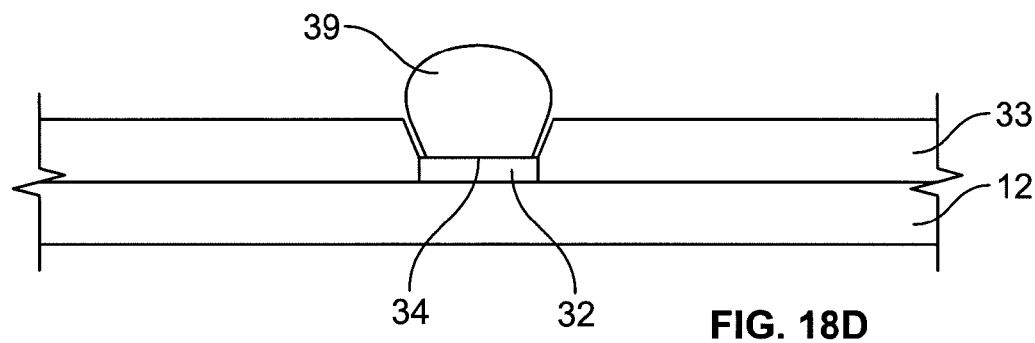

Referring to FIG. 18D, a mass 39 including electrically conductive material, for example, solder material, a conductive paste or a conductive matrix material, may cover the front surface 34 of the pad 32 and extend upwardly therefrom through the layer 33.

Figure 2:
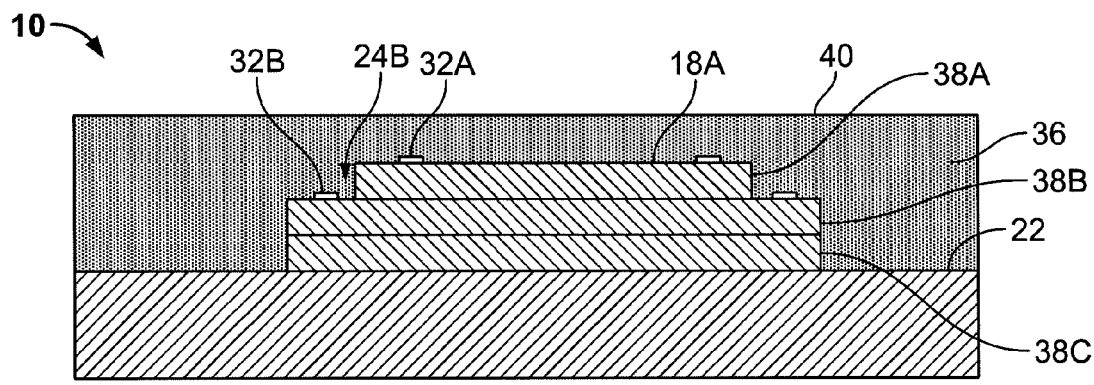

Referring to FIG. 2, in one stage of fabrication of the package 10, a layer of encapsulant 36 may be formed over uncovered portions of the surface 22 extending away from the stacked unit 14 and uncovered portions of the stacked unit 14, which include the front surface 18A of the chip 12A, the portions 24B and 24C of the front surfaces of the chips 12B and 12C, and vertically extending lateral surfaces 38A, 38B, 38C of the respective chips 12A, 12B, 12C. The encapsulant, which protects the encapsulated components from the external environment, may include dielectric material or resin. In one embodiment, the encapsulant may be formed by a molding process that forms a planar top surface 40 of the encapsulant 36.

Figure 3:
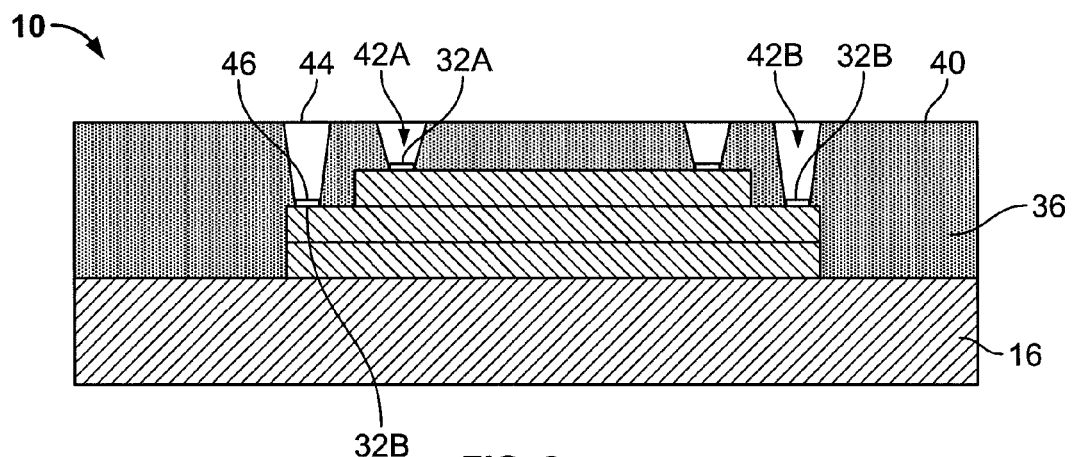

In a further stage of fabrication, referring to FIG. 3, holes 42 may be formed extending from the top surface 40 through the encapsulant 36 towards the front surfaces of the chips.

Conductive material covering contacts 32A on the front surface 18A of the chip 12A are exposed within holes 42A, and conductive material covering contacts 32B at the front surface portion 24B of the chip 12B are exposed within holes 42B. In a further embodiment, referring to FIGS. 6A and 6B, conductive material covering contacts 32C at the front surface portion 24C of the chip 12C can be exposed within holes 42C.

The holes 42 may extend along vertical or generally vertical axes away from the chips. The holes 42 may be substantially cone-shaped or cylindrically-shaped having substantially circularly-shaped top ends 44 at the surface 40 and substantially circularly-shaped bottom ends adjacent the contact 32 on the front surface of the chip. In another embodiment, the holes 42 may have an average diameter or width of about 25-50 microns. The difference between the diameter or width of the top ends 44 of the holes and the diameter or width of the bottom ends 46 may be about 5-10 microns. In some examples, the width of the bottom end of a hole can be smaller than the width at the top end; in another example, the bottom end width of the hole can be the same as the top end width.

In one embodiment, the holes 42 may be formed in the encapsulant by ablating, such as using a laser, punching, or etching of the encapsulant. When the encapsulant is ablated, such as using a laser, the conductive material covering the contacts 32 avoids the contacts 32 from being exposed to laser light, which may damage the contact or other electronic components of the chip that are adjacent the contact.

In another embodiment, the encapsulant 36 can be prefabricated to have the shape of the edges and front surfaces of the stacked unit 14 and the top surface 22 of the carrier plate, and also include pre-formed holes patterned to match exposed element contacts 32 of the stacked unit. The encapsulant 36, in a softened state, may then be attached, e.g., pressed into position over the stacked unit and the carrier plate, so that the holes are vertically aligned with the contacts 32. In one embodiment, the encapsulant in such case may be partially cured, e.g., a "B-stage" material, when attached to the stacked unit.

In another embodiment, one or more of the contacts 32 may include a projection, e.g., a post, conductive mass, bump, stud bump, etc. at the front surface having a vertical height (see FIGS. 18A-18D) to provide that a top surface of such projection is adjacent the top surface 40 of the encapsulant 36.

Figure 4:
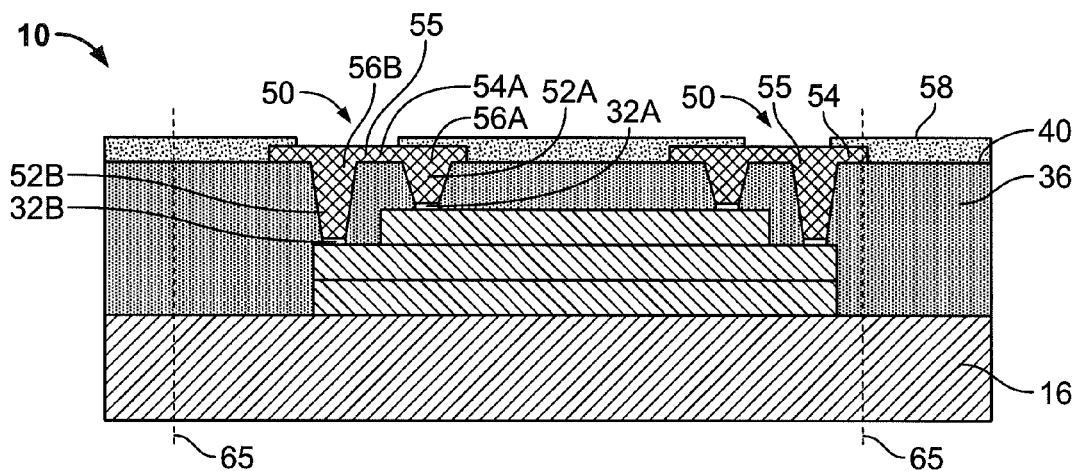

In a further stage of fabrication, referring to FIG. 4, a continuous monolithic metal feature 50 may be formed which includes a conductive via 52 extending from the top surface 40 downwardly through the hole 42 towards the contact 32, and a conductive portion 54 extending along the top surface 40 away from exposed top surface 56 of the via 52. For example, the metal feature 50 may include the conductive via 52A extending from the top surface 40 to a bump or post covering the contact 32A, the conductive via 52B extending from the top surface 40 to a solder mass covering the contact 32B and a conductive trace 54A of the conductive portion 54 extending along the top surface 40 and connected to the vias 52A, 52B at the exposed top surfaces 56A and 56B. The vias 52 and the conductive portion 54 may include an etchable conductive material, which is desirably a metal, such as copper, a copper-based alloy, aluminum, nickel and gold.

In one embodiment, the metal feature 50 may be formed by deposition, for example, electrolytic or electroless metal plating, deposition of conductive material or a conductive matrix material, or by printing of a conductive paste selectively, using a stencil, into the holes to form the conductive vias and along portions of the top surface 40 of the encapsulant to form the conductive portion 54. The traces 54A desirably may be connected with the vias 52, and in particular the surfaces 56, along the top surface 40 without the use of solder. In addition, at least a portion of the conductive portion 54 at the top surface 40 may serve as a terminal 55 of the package 10.

In a further embodiment, a conductive seed layer (not shown) may be formed in the holes 42 and along the surface 40, before the conductive vias 52 and the conductive portions 54 are formed.

In one embodiment, a solder resist layer 58 may be formed overlying portions of the conductive portion 54 and uncovered portions of the top surface 40, to provide that only the terminal 55 is exposed at the top surface of the package 10.

The various fabrication steps described above desirably may be conducted on a plurality of stacked units that are mounted to the carrier plate 16. As such, individual ones of the packages 10 can be obtained by severing of the encapsulant and the plate 16 between the stacked units at dicing lanes 65, as described below.

Figure 5:
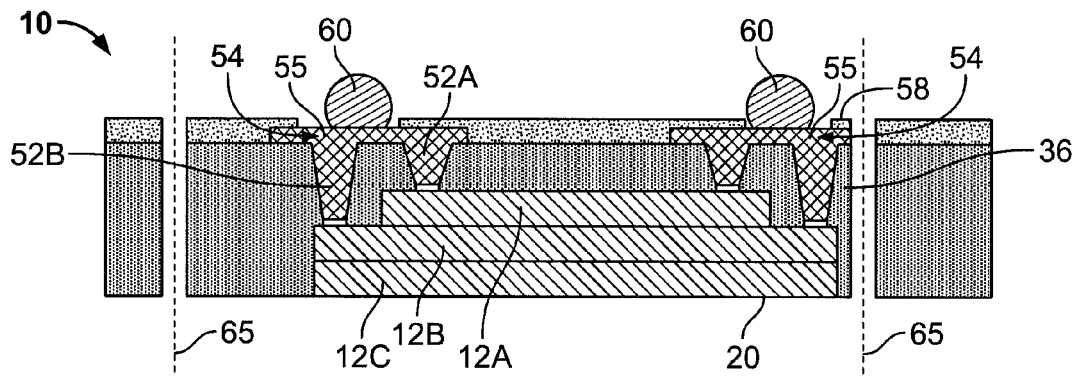

Referring to FIG. 5, joining units, which may include masses 60 of electrically conductive material, such as a bond metal, solder, conductive paste, a conductive matrix material or the like, may be formed on exposed portions of the outer surfaces of the conductive portions serving as the terminals 55, following formation of the solder resist layer 58. The masses 60 may be electrically interconnected with the conductive traces 54A and the vias 52 forming the metal feature 50, through the terminal 55. The masses 60 may include a bond metal such as solder, gold, tin or indium. In addition, the carrier plate 16 may be removed, such as by sanding, etching or like techniques.

Individual packages 10, each including a stacked microelectronic unit 14 having the solder masses 60 joined to the terminals 55 thereof, may then be formed by severing, e.g., such as by sawing or scribing of the encapsulant and the carrier plate, along the dicing lanes 65. In an alternative embodiment, the severing may be performed to obtain the individual packages before the carrier plate 16 is removed.

Figure 6C:
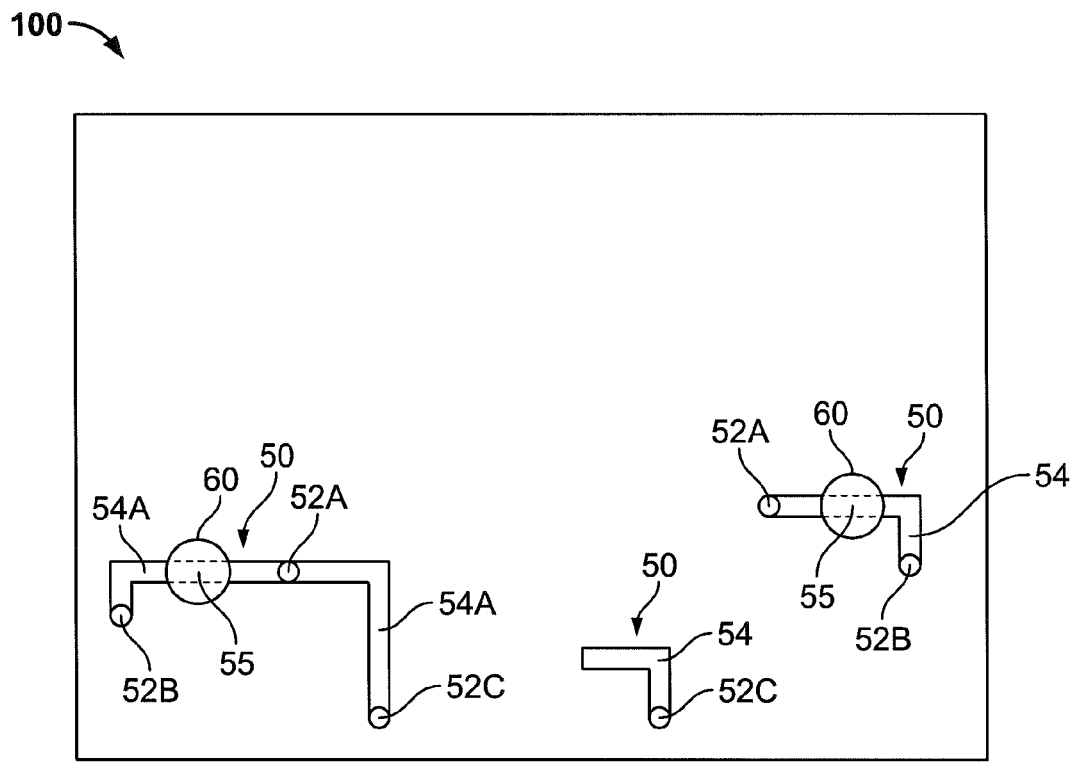
FIG. 6C is a top, plan view of the top surface of the package of FIG. 6A.

Referring to FIGS. 6A-6B, a microelectronic package 100 may have the same construction as the package 10 described above, and furthermore include conductive vias 52C that extend from the top surface 40, through the encapsulant 36, and toward the contacts 32C at the portion 24C. As shown in FIG. 6C, which is a top plan view of the top surface of the package 100, the conductive vias 52C may be part of the metal feature 50, which further includes the vias 52A and 52B and the conductive traces 54A extending along the top surface 40 and connected to the vias 52A, 52B and 52C at the top surfaces 56 thereof. The conductive portions 54 of the metal features 50 may also include terminals 55 to which the solder masses 60 are joined.

Advantageously, a microelectronic package with a stacked microelectronic unit including vertically stacked microelectronic elements, such as chips, may include a conductive structure that electrically connects contacts of the chips to terminals at the top surface or the bottom surface of the package, where the conductive structure desirably includes a continuous monolithic metal feature that extends along a top surface of the package and through an encapsulant towards the contacts of the chips, to provide for conductive paths of reduced length extending from the contacts to the terminals, and where the terminals may be usable for connection to a microelectronic component external to the package.

Referring to FIG. 6A, in one embodiment, the microelectronic package 100 may be formed with terminals 55 that can be used to connect the package 100 to corresponding contacts (not shown) of an external microelectronic element 150, which may be a circuit panel included in electronic devices such as a smart phone, mobile phone, personal digital assistant (PDA) and the like, with bonding material, such as solder, between the terminals and the circuit panel that joins the package 100 with the circuit panel. In a further embodiment, the bonding material may be the solder masses 60 of the package 100. Alternatively, the solder masses 60 may be omitted from the package, and bonding material, such as solder, may be applied at the terminals when the package 100 is joined to the external microelectronic element 150 to form a microelectronic assembly.

Figure 6D:
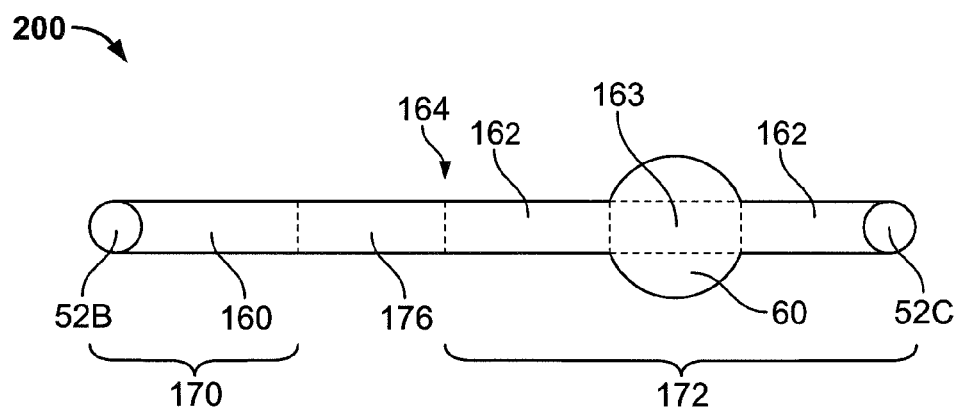
FIG. 6D is a top, plan view of a portion of a top surface of a microelectronic package, in accordance with another embodiment of the disclosure.

FIG. 6D illustrates a top view of a portion of a microelectronic package 200, having a construction of vias extending through an encapsulant towards contacts of stacked chips of a stacked unit similar to the package 100 described above, and including a conductive structure 164 that electrically connects the contacts to conductive portions extending along the top surface 40 of the encapsulant. The conductive structure 164 may desirably include a continuous monolithic metal feature extending along the top surface 40 and through a portion of an encapsulant towards contacts of the stacked chips. For example, the conductive structure 164 may include a conductive trace 160 extending along the top surface 40 of the encapsulant in the package 200, where the trace 160 is a continuous monolithic metal feature 170 with the conductive via 52B. In one embodiment, the metal feature 170 may include the trace 160 and the via 52B. In addition, a conductive trace 162 may be directly connected to the via 52C as a continuous monolithic metal feature 172 including the trace 162 and the via 52C, where the conductive trace 162 is part of a conductive portion further including a terminal 163 to which a solder mass 60 is joined. Further, the metal features 172 and 170 may be connected at the top surface of the package by a conductive connective portion 176 extending along the top surface that electrically connects the traces 160 and 162, where the connective portion 176 is not continuous with conductive material forming the metal features 170 and 172. In one embodiment, the connective portion 176 may be a top surface of a conductive via extending through the encapsulant of the package towards a contact of a stacked chip.

In a further embodiment of the package 200, the solder mass 60 may be joined to the connective portion 176 instead of the conductive trace 162, such that the connective portion 176 serves as a terminal of the package 200 and the metal features 170 and 172 electrically connect the contacts of the chips of the stacked unit of the package 200 to the terminal 176.

Figure 7A:
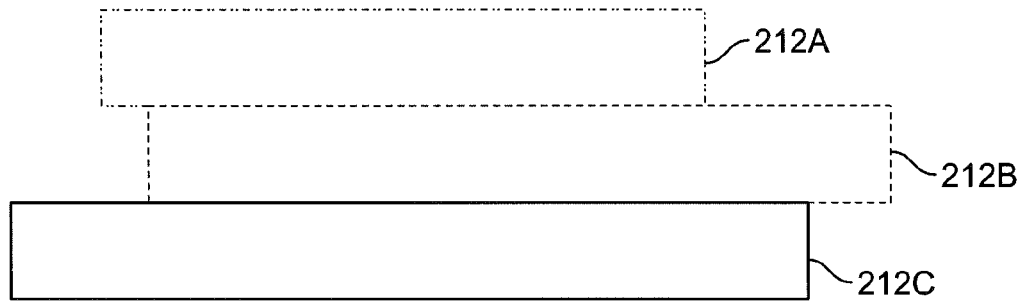
FIG. 7A is a diagrammatic sectional view of an exemplary stacked microelectronic unit, in accordance with another embodiment of the disclosure.
Figure 7B:
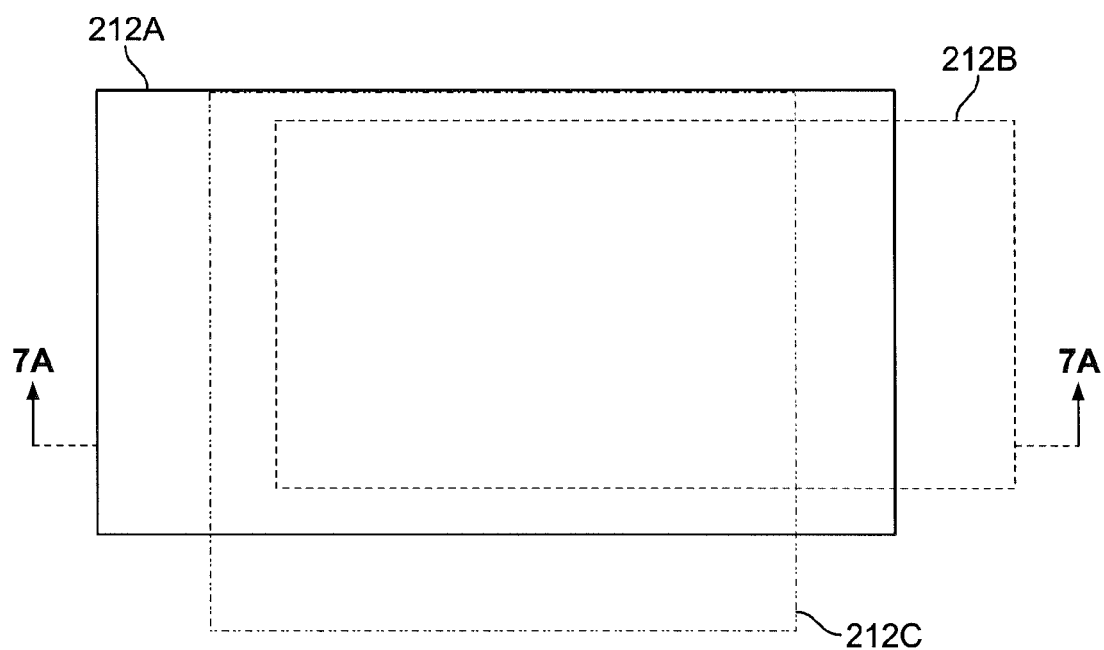
FIG. 7B is a top, plan view of the stacked unit of FIG. 7A.

FIGS. 7A and 7B illustrate an alternative embodiment of a vertical stacking arrangement of chips 212A, 212B and 212C in a stacked microelectronic unit, in which a portion of a front surface of a chip underlying one or more of the chips of the stack, such as the chip 212C underlying the chips 212B and 212A, extends beyond an edge of the overlying chips. Such arrangement may permit the chips to be of the same type and have the same shape and size, for example. As discussed above, such vertical stacking of chips in a stacked unit permits conductive vias to be formed extending from the top surface of the package, through the encapsulant, towards contacts at the portions of the front surface of the underlying chip extending beyond the edge of the overlying chip. It is to be understood that, in accordance with the present disclosure, various arrangements of a plurality of chips vertically stacked one over the other may be provided, in which a portion of the front surface of an underlying chip having a contact extends beyond the edge of an overlying chip, so that an electrical connection which is part of a metal feature may be formed from conductive material, such as a conductive via, extending towards such contact on the front surface of the underlying chip.

Figure 21:
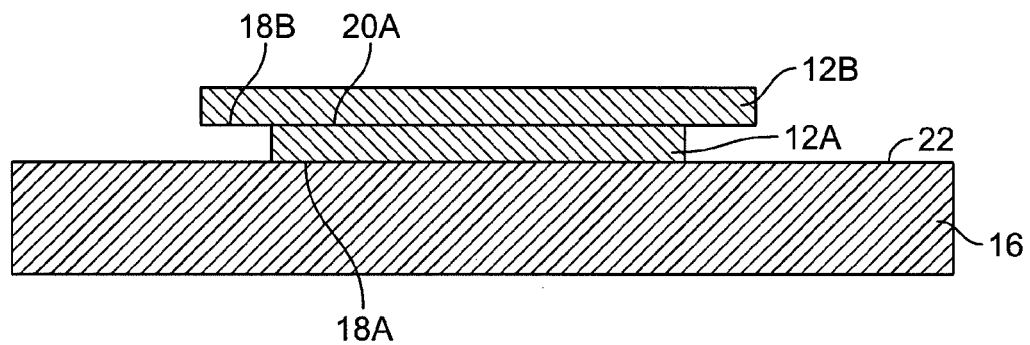
FIGS. 21-23 are diagrammatic sectional views illustrating stages in a method of fabricating a microelectronic package including vertically stacked microelectronic elements, in accordance with another embodiment of the disclosure.
Figure 22:
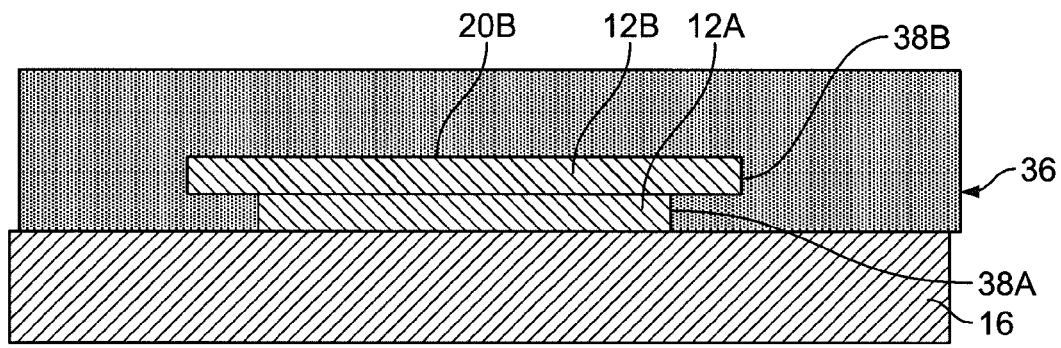
Figure 23:
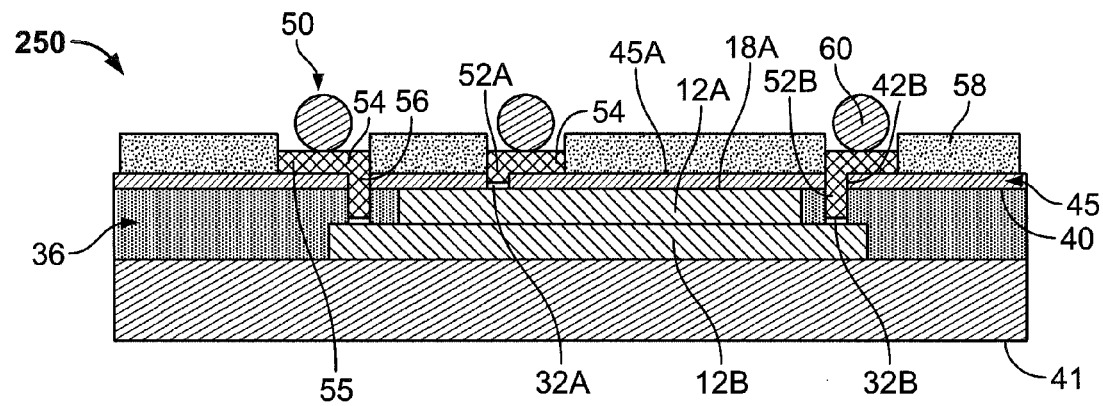

FIGS. 21-23 illustrate exemplary steps for fabricating an embodiment of a microelectronic package 250 having features similar to the package 10 except that the chip 12C and the conductive via extending therefrom are omitted for ease of description. Like reference numbers designate elements of the package 250 that are the same as elements in the package 10. Referring to FIG. 21, the package 250 may include the stacked microelectronic unit 14 with the front surface 18B of chip 12B facing the rear surface 20A of the chip 12A similarly as shown in FIG. 1. The front surface 18A of the chip 12A is attached to the front surface 22 of the carrier plate 16, such that the front surfaces of the chips of the stacked unit face downwardly. The chip 12A may be attached to the carrier plate, for example, by a releasable adhesive (not shown). Referring to FIG. 22, a layer of encapsulant 36 may be formed, similarly as described above for the package 10, over the uncovered portions of the surface 22, and uncovered portions of the stacked unit, which include lateral surfaces 38A, 38B of the chips 12A, 12B, respectively, and the rear surface 20B of the chip 12B.

Referring to FIG. 22, the stacked unit 14 may be separated from the carrier plate 16 by removing the stacked unit 14 from the releasable adhesive.

Referring to FIG. 23, a layer of dielectric material 45 may be formed over the front surface 18A of the chip 12A and the top surface 40 of the encapsulant 36 extending away from the front surface 18A. Holes 42 may then be formed extending through the dielectric layer 45 and the encapsulant 36 towards the front surfaces of the chips 12A, 12B, to expose conductive material covering the contacts 32 thereof. The package 250, hence, may have a planar top surface including portions of front surface 45A of the dielectric layer 45. Conductive vias 52 may be formed to extend through the holes 42 in the layer 45 and the encapsulant 36, and conductive portions including traces 54A may be formed on the front surface 45A of the dielectric layer 45 extending away from exposed top surface of the vias 52. Similarly as in the package 10, the vias 52 and the traces 54A may form a continuous monolithic metal feature 50 in the package 250. Further, a solder resist layer 58 may be provided on the front surface 45A of the layer 45 to form terminals 55 to which solder masses 60 are joined, similarly as in the package 10. In this embodiment, a rear surface 41 of the encapsulant 36 is a bottom surface of the package 250.

In one embodiment of the package 250, the dielectric layer 45 may be omitted, such that the package 250 has a planar top surface including the front surface 18A of the chip 12A and the top surface 40 of the encapsulant extending away from the front surface of the chip 12A.

Figure 24:
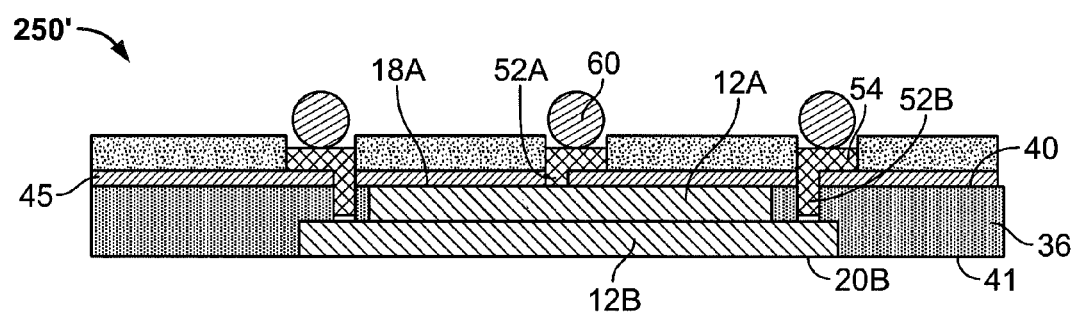
FIG. 24 is a diagrammatic sectional view of a microelectronic package formed using the method of FIGS. 21-23, in accordance with one embodiment of the disclosure.

In a particular embodiment, referring to FIG. 24, one or more techniques such as etching, sandblasting, grinding, lapping or polishing, or other technique may be applied to remove encapsulant from the rear surface 20B, so that the rear surface 20B is not covered by encapsulant and, thus, forms a part of the bottom surface of a package 250'. The package 250', hence, may have a planar top surface formed from front surface portions of the layer 45, or if the layer 45 is omitted the top surface of the package 250' includes the front surface 18A of the chip 12A and the top surface 40 of the encapsulant extending away from the front surface of the chip 12A. Further, the package 250' has a planar bottom surface including the rear surface 20B of the chip 12B and the rear surface 41 of the encapsulant extending away from the rear surface of the chip 12B.

Figure 8A:
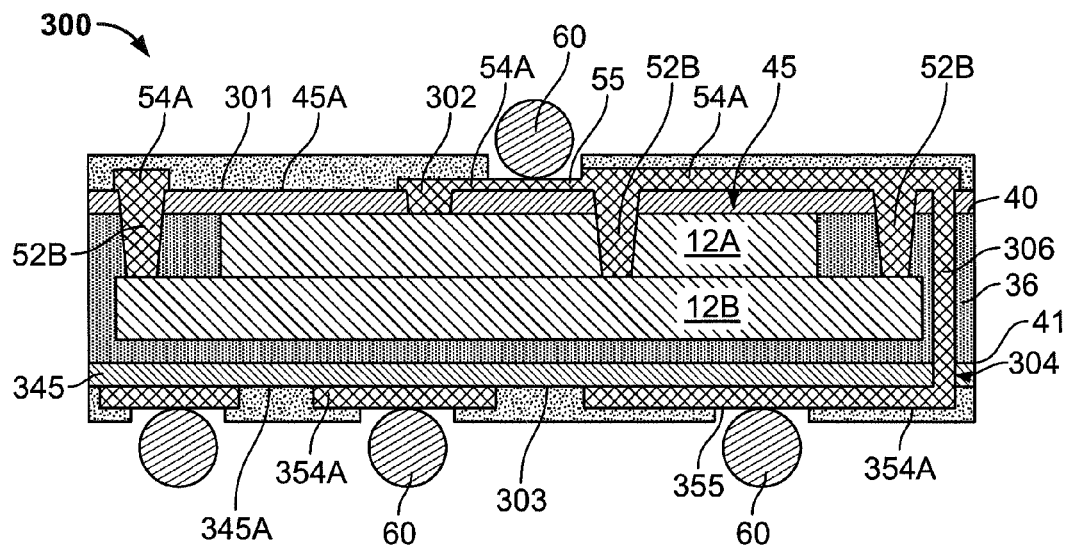
FIG. 8A is a diagrammatic sectional view of a microelectronic package with a stacked microelectronic unit, in accordance with another embodiment of the disclosure.
Figure 8B:
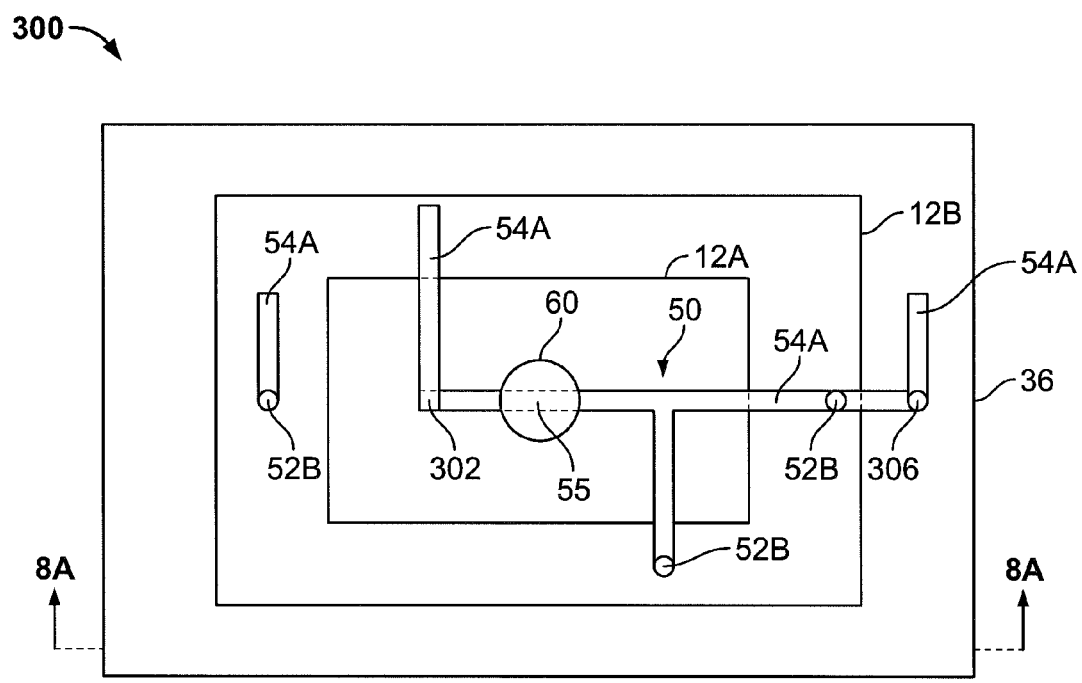
FIG. 8B is a top, plan view of the package of FIG. 8A.

FIGS. 8A and 8B illustrate a further embodiment of a microelectronic package 300 having features similar to the package 250 (see FIG. 23). The package 300 has a planar top surface 301 including the front surface 45A. A contact element 302 at the front surface 18A of the chip 12A is connected to the conductive trace 54A, which extends along the top surface 301 from the contact element 302 to a terminal 55 at the top surface 301. In addition, conductive portions 354 may be selectively formed, using similar techniques as described above to form the portions 54, at a bottom surface 303 of the package 330, which is opposite the top surface 301. The bottom surface 303 includes portions of a rear surface 345A of a dielectric layer 345 overlying the rear surface 41 of the encapsulant 36. The portions 354 may include traces 354A and a terminal 355, which may be joined to a solder mass 60. The bottom surface 303 of the package 300 may be a planar surface. In one embodiment, the layer 345 may be omitted, such that the bottom surface 303 of the package 300, along which the conductive portions 354 extend, includes the bottom surface 41 of the encapsulant. Also in this embodiment, a hole 304 may extend from the top surface 40, through the dielectric layer 45 and the encapsulant 36, to the rear surface 41 of the encapsulant, and through the dielectric layer 345 if present. The hole 304 may be fabricated similarly as the hole 42, and a conductive via 306 may be formed in the hole 304 to electrically connect a conductive element 354A, e.g., a pad or trace, at the bottom surface of the package, to a conductive element 54A, e.g., a pad or trace, at the top surface of the package. Advantageously, conductive portions along the bottom and top surfaces of the package may be electrically connected to each other by vias extending through the encapsulant of the package, to provide that terminals may be formed on opposite surfaces of the package and, thus, permit ease of package-on-package stacking by use of packages similar to the package 300.

Figure 8C:
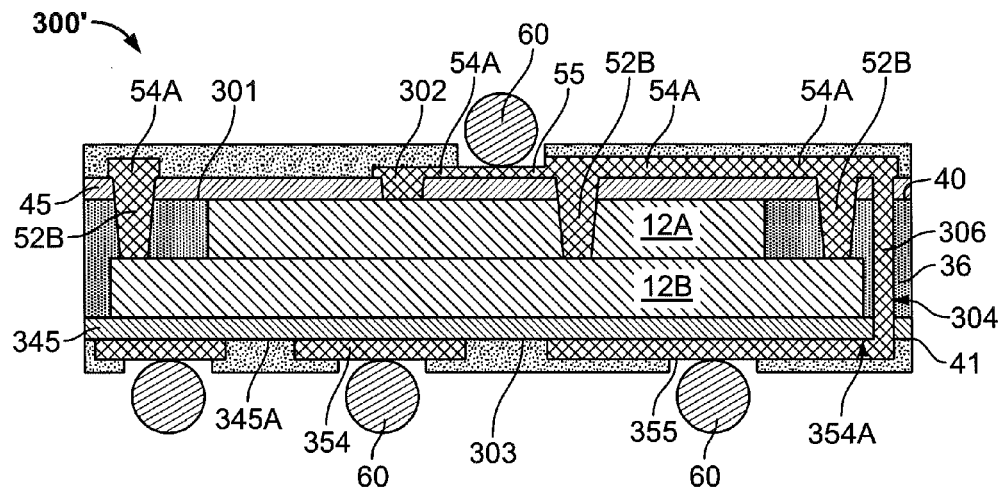
FIG. 8C is a diagrammatic sectional view of a microelectronic package with a stacked microelectronic unit, in accordance with another embodiment of the disclosure.

In a further embodiment, referring to FIG. 8C, the encapsulant at the bottom surface of the package 300 as shown in FIG. 8A may be removed to obtain the package 300'. In the package 300', the bottom surface 303 may be a planar surface, and include rear surface 345A of the dielectric layer 345. If the layer 345 is omitted from the package 300', the bottom surface 303 includes the rear surface 20B of the chip 12B and the rear surface 41 of the encapsulant extending away from the surface 20B.

Figure 9:
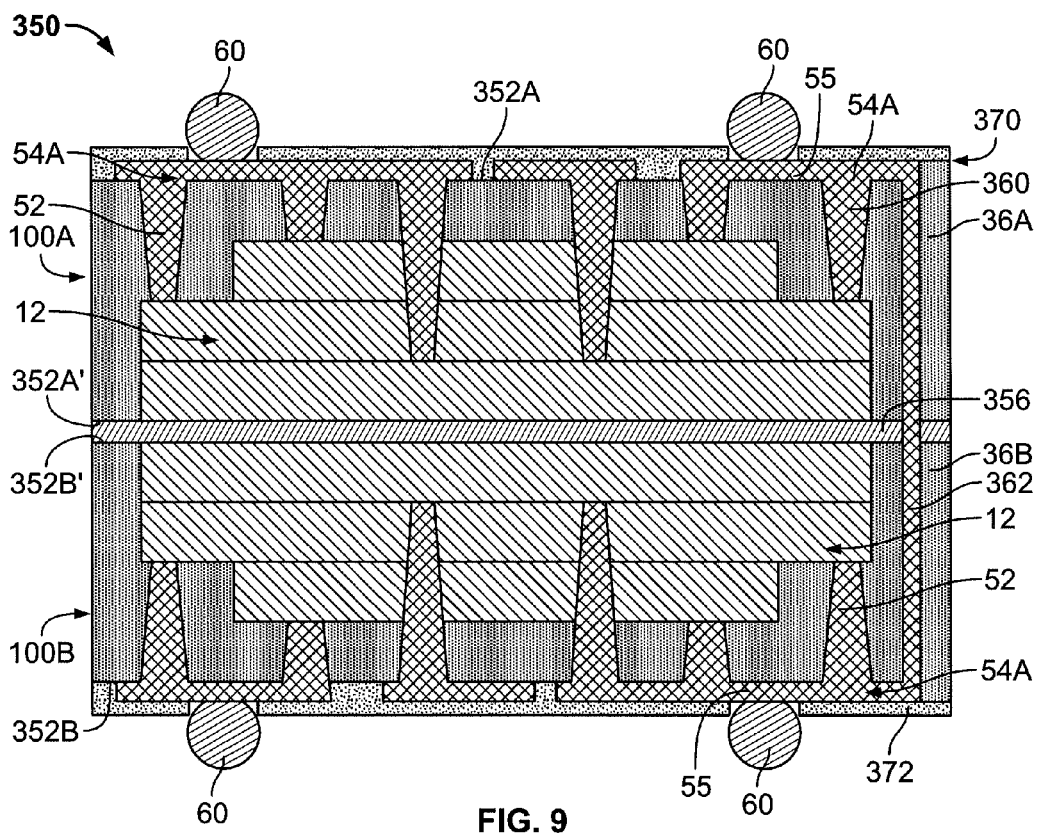
FIG. 9 is a diagrammatic sectional view of a microelectronic assembly including stacked microelectronic packages, each package including a stack of microelectronic elements, in accordance with another embodiment of the disclosure.

FIG. 9 illustrates a microelectronic assembly 350 including microelectronic packages 100A and 100B having the same construction as the package 100, and stacked one on top of the other to provide for assembly-on-assembly stacking. In the assembly 350, the package 100A has a planar top surface 352A along which the conductive traces 54A extend and at which the solder masses 60 are joined to the terminals 55, and a bottom surface 354A opposite to the top surface 352A. The bottom surface 354A may be attached to a bottom surface 354B of the package 100B by a layer of adhesive 356, such that the packages 100A and 100B are arranged in an inverted configuration with the bottom surfaces facing each other. With the packages 100A, 100B attached to each other, a hole 360 may be formed extending from the top surface 352A, through the encapsulant 36A of the package 100A, the adhesive layer 356, the encapsulant 36B of the package 100B and to the top surface 352B of the package 100B. A conductive via 362 may extend through the hole 360, and the traces 54A extending along the respective top surfaces of the packages 100A, 100B may extend from the via 362. The hole 360 and the via 362 may be formed similarly as described above for the holes 42 and vias 52. The traces 54A may extend to terminals 55 at the respective top surfaces, such that the via 362 electrically connects the terminals 55 at the top surfaces of the packages 100A, 100B with each other. Advantageously, in the assembly 350, the packages 100A, 100B are stacked in an inverted configuration to provide that terminals 55 are disposed at top surface 370 and opposing bottom surface 372 of the assembly 350, to permit assembly-on-assembly stacking.

In one embodiment, the assembly 350 may include a continuous monolithic metal feature formed from the via 362, the traces 54A at the respective top surfaces of the packages 100A, 100B and a via 52 extending toward a contact of a chip 12 of one or both of the packages 100A, 100B.

Figure 10:
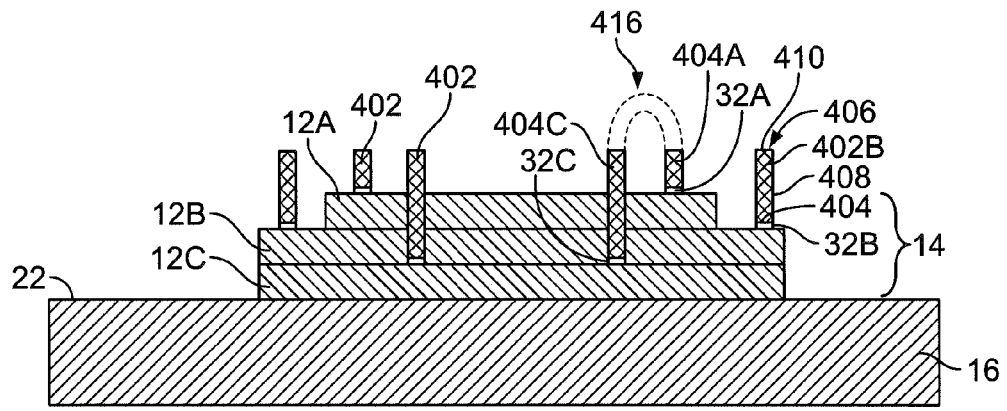
FIGS. 10-12 are diagrammatic sectional views illustrating stages in a method of fabricating a microelectronic package including vertically stacked microelectronic elements, in accordance with another embodiment of the disclosure.
Figure 11:
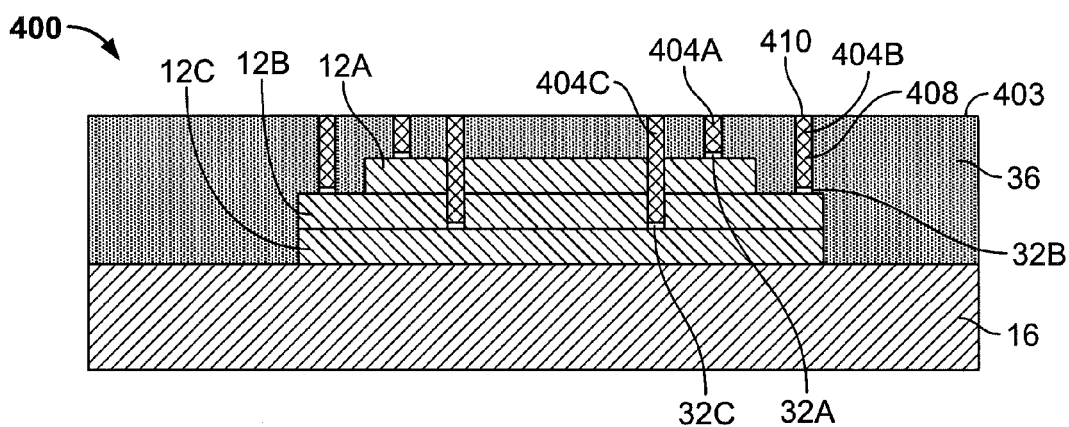
Figure 12:
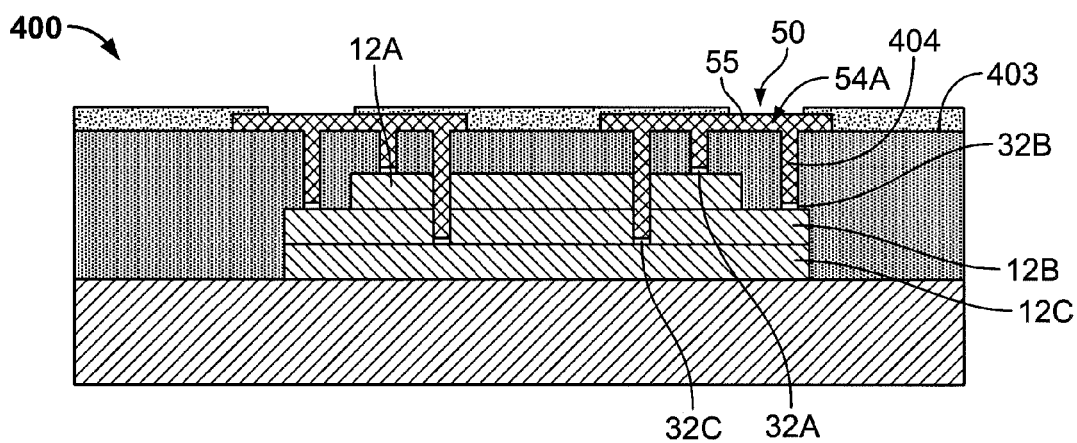
Figure 13:
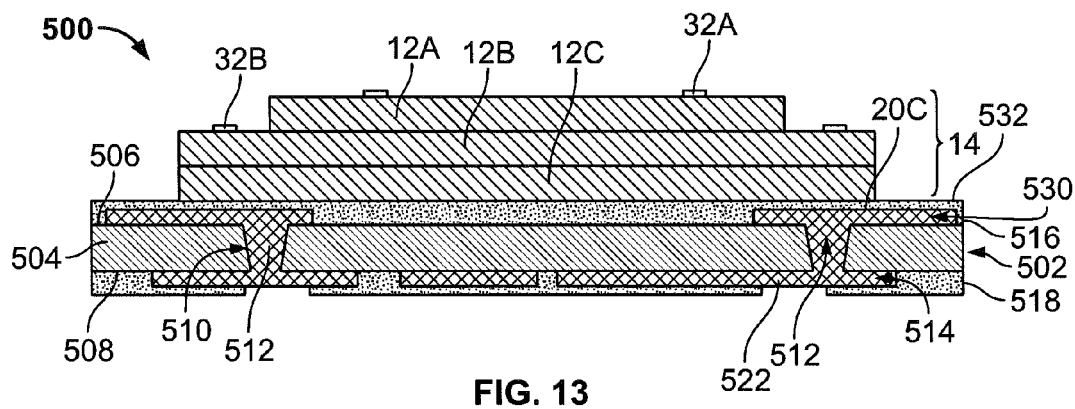
FIGS. 13-16 are diagrammatic sectional views illustrating stages in a method of fabricating a microelectronic package including vertically stacked microelectronic elements, in accordance with another embodiment of the disclosure.

In a further embodiment, referring to FIGS. 10-12, a microelectronic package 400 may have features similar to the package 100, except that a conductive structure electrically connecting the terminals to the contacts of the chips includes wire bonds. Referring to FIG. 10, the stacked unit 14 mounted to the carrier plate 16 may have wire bonds 402 applied on the exposed contacts 32 of the chips 12. In one embodiment, the wire bonds 402 may be applied by heating an end of a wire exposed at an end of a capillary, the wire typically of gold, copper or copper alloy, to soften the end such that it forms a ball bond to the contact 32 when pressed thereto, forming a base 404. The wire is then drawn out away from contact 32 and manipulated, if desired, in a specified shape before being cut or otherwise severed to form end 406 of the wire bond 402.

Alternatively, wire bonds can be formed by wedge bonding. Wedge bonding is formed by heating a portion of the wire adjacent the end thereof and dragging it along the contact 32 with pressure applied thereto. An aluminum wire bond can be formed this way. Such a process is described further in U.S. Pat. No. 7,391,121, the disclosure of which is hereby incorporated by reference herein in its entirety.

Referring to FIG. 11, the encapsulant 36 is formed over uncovered surface portions of the stacked unit 14 and uncovered portions of the top surface 22 similarly as shown in FIG. 2, and also along edge surfaces 408 and top end surface 410 of the wire bonds 402, such as by a molding process. Alternatively, the encapsulant can be prefabricated to the desired size and shape, similarly as described above. In this alternative configuration, the encapsulant may be attached, such as by pressing into position over the wire bonds 402, the chips 12 of the stacked unit 14 and the plate 16. In one embodiment, the encapsulant may be partially cured material, e.g., a "B-stage" material, when attached to the stacked unit 14. Alternatively, any excess encapsulant material can be removed to expose the end surfaces 410 at the top surface 403.

In a further alternative, the encapsulant 36 can be formed by removal of a portion of the dielectric material used to form the encapsulant by grinding, dry etching, laser etching, wet etching, lapping, or the like, such that the surface 410 of the wire bond is flush with the top surface 403.

In an alternative embodiment, referring to FIG. 10, wire bonds 404A and 404C may be initially formed in pairs as portions of a wire loop 416, and following application of the encapsulant material, a portion of the encapsulant material is then removed by grinding, etching or the like by a process that also removes a portion of loop 416, such that the loop is severed and divided into two portions forming the wire bonds 404C and 404A. See Korean Patent Application No. 10-2011-0041843 filed May 3, 2011, incorporated by reference herein.

Referring to FIG. 12, electrically conductive material may be applied at the top surface 403 to form conductive traces 54A, similarly as described above for the package 10. The conductive traces 54A may extend from and contact the wire bonds 402 to form a conductive structure electrically connecting a terminal 55 at the top surface 403 with the contacts 32 at the front surface of one or more the chips 12.

In another embodiment, referring to FIGS. 13-16, a microelectronic package 500 may include a stacked microelectronic unit 14 mounted on a substrate 502. The substrate 502 may include an element, e.g., a board-like or sheet-like element 504, of dielectric or semiconductor material having a front surface 506 and an opposing rear surface 508. In one example, the element 504 may include or consist essentially of a material having a relatively low coefficient of thermal expansion ("CTE"), such as a CTE of 10 parts per million per degree Celsius (PPM/° C.) or less. In particular examples, the low CTE material may include one or more of silicon, glass, ceramic or a liquid crystal polymer. The element 504 typically includes electrically conductive portions 516 at the front or chip facing surface 506 thereof, and terminals 522 at or exposed at a rear package-mounting surface 508 thereof which are electrically connected thereto. Conductive portions 516 may be electrically connected with the terminals 522 by additional conductive elements, e.g., traces, pads, and/or electrically conductive vias 512, which may be disposed at one or more of the front or rear surfaces or be disposed between the front or rear surface in one or more metal layers of the element 504. The conductive portions 514, 516 may include the same material used to form conductive portion 54, and be formed by photolithographic patterning or lamination to the substrate, such as disclosed in U.S. application Ser. No. 13/105,325 filed May 11, 2011, incorporated by reference herein.

A solder resist layer 518 may overlie uncovered portions of the rear surface 508 of the dielectric layer 504, and be patterned to cover conductive portions 514, leaving terminals 522 exposed at the surface 508.

In addition, a dielectric layer 530 may optionally overlie portions of the front surface 506 and conductive portions 516 beyond an edge of one or more of the chips 12. Such dielectric layer 530 may be an adhesive that bonds the rear surface 20C of the chip 12C to a portion of the top surface 532, or may be in addition to an adhesive used for that purpose.

Figure 14:
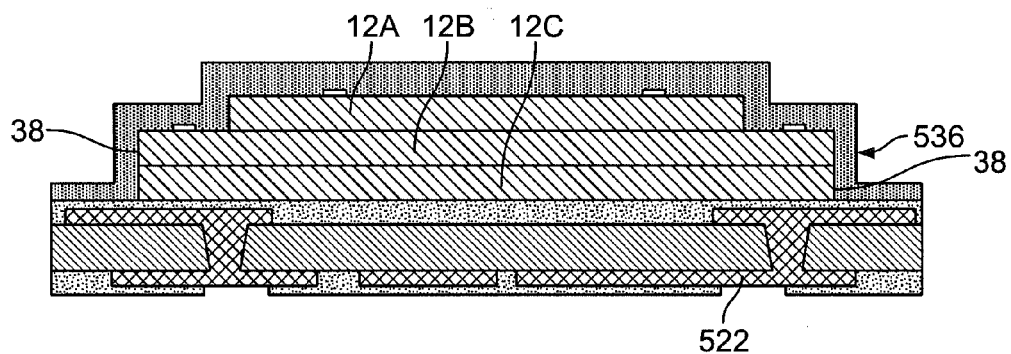

Referring to FIG. 14, a layer of dielectric, e.g., encapsulant material, may be conformally applied as a coating over the stacked unit 14 mounted to the substrate 502 to form an encapsulant 536 covering edge surfaces 38 of the stack, uncovered portions of the front surfaces of the chips of the stacked unit 14, and uncovered portions of the top surface 532 of the substrate 502. The encapsulant 536 may include the same or a different dielectric material as described above for the encapsulant 36. The encapsulant 536 may be formed on the stacked unit 14 by a process other than molding or the like, to provide for a stepped, three-dimensional shape at the edges 38 of the stacked unit 14.

Figure 15:
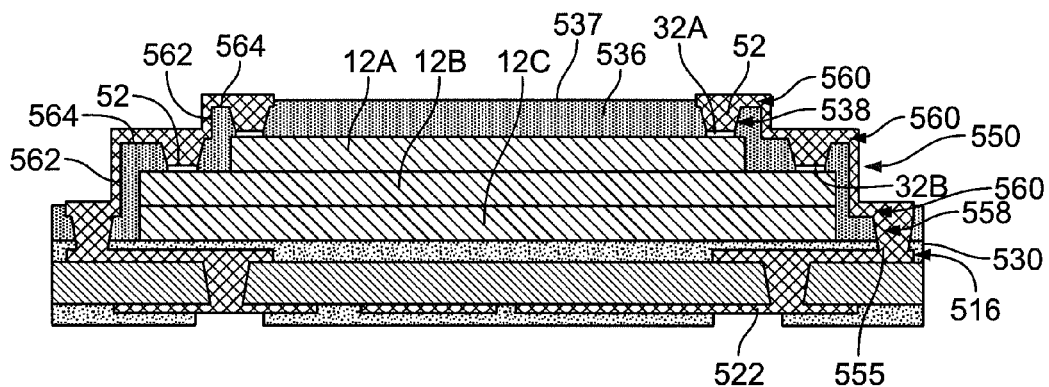

Referring to FIG. 15, holes 538 may be formed through the encapsulant 536 extending towards the contacts of the chips and exposing the conductive material covering such contacts 32, using techniques similarly as described above for formation of the holes 42. In addition, the holes 538 may be formed extending through the encapsulant 536, a portion of the dielectric layer 530, if present, and to a portion 555 of the conductive portion 516. Conductive material may be applied to fill the holes 538 to form the conductive vias 52 extending towards the contacts 32, and conductive vias 558 extending to the terminal 555. The conductive vias 558 may be formed similarly as the vias 52, as discussed above. In one embodiment, the portion 555, from which the via 558 extends, may serve as a terminal at the top surface of the substrate 502.

In addition, electrically conductive elements, such as traces 560, may be formed on edge surfaces 562 of the encapsulant, and top surface portions 564 of the encapsulant extending from the edge surfaces 562. The top surface portions 564 are in different planes that correspond to the planes in which the front surfaces of the respective chips 12A, 12B and 12C extend. The traces 560 are formed to contact the vias 52, which extend towards the contacts 52, and the vias 558, which extend towards the terminal 555, so as to electrically connect the contacts 32 with the terminal 555. The traces 560 may be formed by any suitable metal deposition technique, which may include sputtering, electroless or electrolytic plating, or printing or stenciling of an electrically conductive paste or conductive matrix material, for example. A three-dimensional photolithography process may be employed to define locations of the conductive elements, e.g., traces, such as disclosed in U.S. Pat. No. 5,716,759, incorporated by reference herein. In one embodiment, the traces extending along the outer surface of the encapsulant 556, with the vias 52 and 55, may form a continuous monolithic metal feature 550 that electrically connects the contacts of the chips with the terminal 555 at the top surface of the substrate.

In one embodiment, the vias may be formed simultaneously with the traces to form the continuous monolithic metal feature 550. The metal feature 550 may be formed to electrically connect the terminal of the substrate with contacts of the chips subsequent to completion of processing performed to fabricate the stacked unit and/or the substrate.

Figure 16:
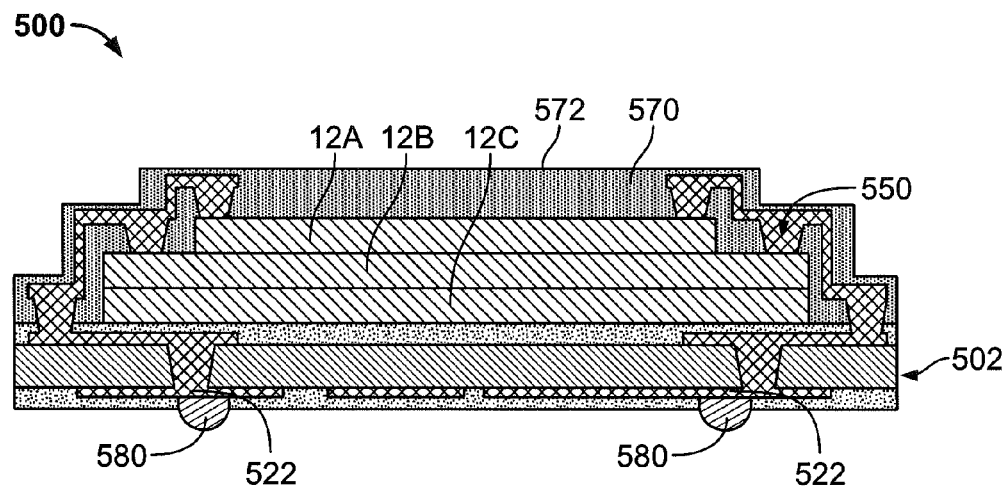

Referring to FIG. 16, a protective coating layer 570 may be formed to cover the traces 560 and outer surface portions 537 of the encapsulant 536, to provide a planar top surface 572 for the package 500, which may facilitate package-on-package stacking of the package 500, such as described below. The coating layer 570 may be formed from dielectric material that is the same or different from the dielectric material forming the encapsulant. In addition, joining units, such as conductive masses, e.g., solder masses 580, having a material such as described above relative to the masses 60, may be formed on exposed portions of the terminal 522. After the solder masses 580 are formed, the package 500 may be severed from other similar packages 500 formed from respective stacked units 14 mounted on the substrate 502 and which undergo the same fabrication processing as described above.

Figure 17:
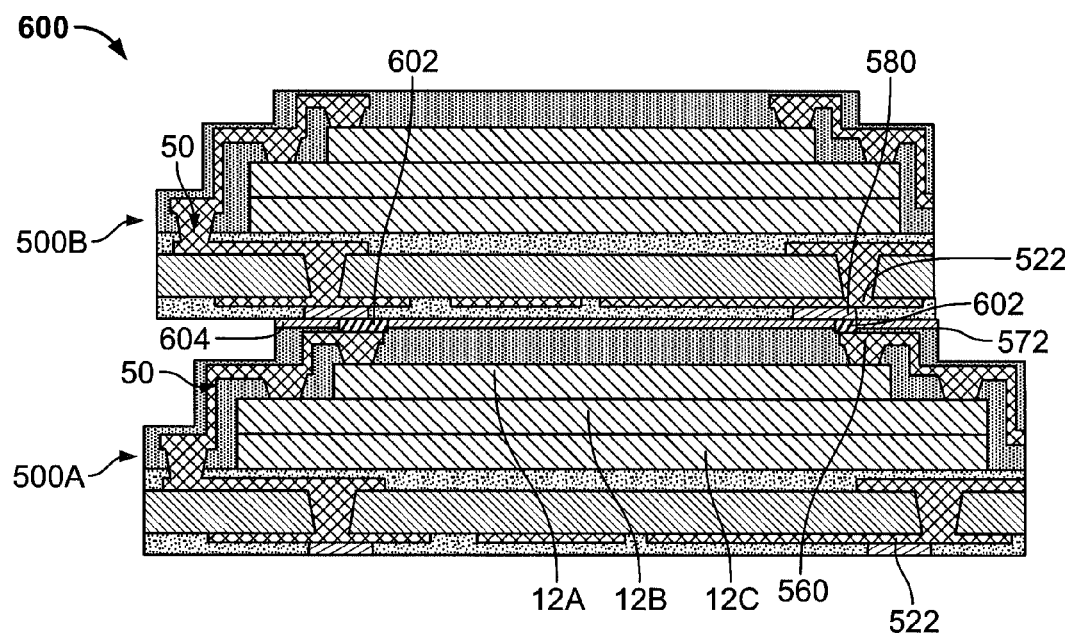
FIG. 17 is a diagrammatic sectional view illustrating a microelectronic assembly including stacked microelectronic packages, each package including stacked microelectronic elements, in accordance with another embodiment of the disclosure.

In another embodiment, referring to FIG. 17, a microelectronic assembly 600 may include microelectronic packages 500A and 500B having the same construction as the package 500, vertically stacked one on top of the other. In the assembly 600, a conductive element 602, e.g., a portion of metal feature 560, may be exposed at a surface of the package, such as within a hole in the protective layer 570 of the package 500A. The conductive element 602 may be formed similarly as described above for the conductive portions 54. The package 500B may be arranged with the bottom surface facing the top surface of the package 500A, with joining units 580 vertically aligned between metal features 560 of the package 500A and terminals 522 of the package 500B. Joining units then may be reflowed, cured or sintered to form joints between the packages 500A, 500B.

Figure 19:
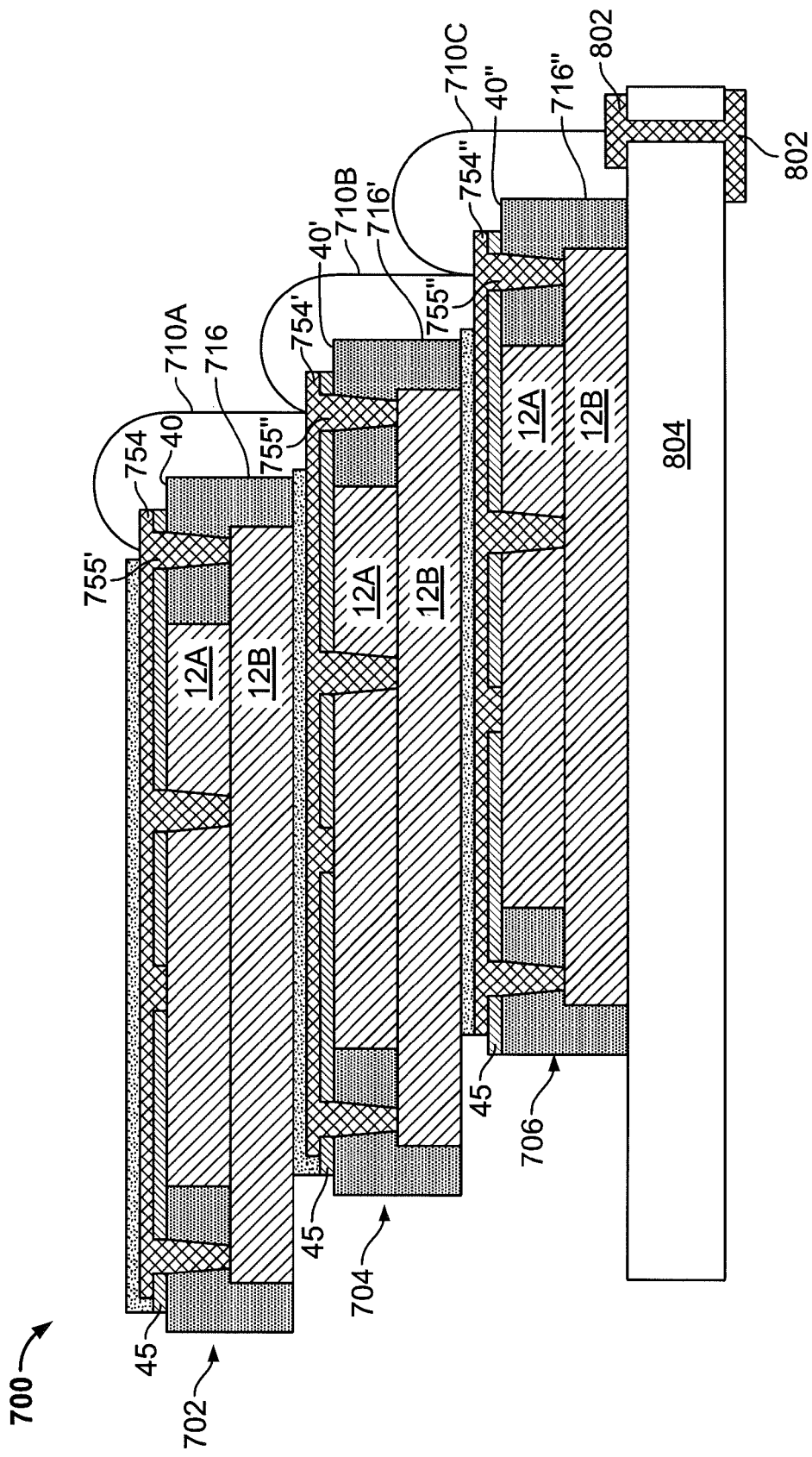
FIG. 19 is a diagrammatic sectional view illustrating a microelectronic assembly including stacked microelectronic packages, each package including stacked microelectronic elements, connected to a microelectronic component external to the assembly, in accordance with another embodiment of the disclosure.

In another embodiment, referring to FIG. 19, microelectronic packages 702, 704, 706 of the type of package 250' shown in FIG. 24, may be stacked and electrically connected with one another. Bond wires 710A, 710B, 710C connected to traces 754, 754' and 754" of the stacked packages 702, 704, 706, respectively, may provide electrical interconnection of the traces 754 to terminals 802 of a circuit panel 804. The bond wires may be arranged to connect terminals 755 of adjacent levels as shown in FIG. 19 or each bond wire may directly connect a package of stacked chips 12 to the circuit panel. Alternatively, some of the bond wires connected to a particular package may be connected to another package which is not adjacent to the particular package.

Referring to FIG. 19, a top surface 40" of an underlying package, such as the package 706, and a conductive portion 754" thereon, extends beyond an edge face 716' of an overlying package, such as the package 704, thus permitting the traces 754' and the 754" to be interconnected using bond wire 710B. Similarly, a top surface 40' of the package 704, and a conductive portion 754' thereon, extends beyond an edge face 716 of the package 702, thus permitting the traces 754 and the 754' to be interconnected using bond wire 710A.

Figure 20:
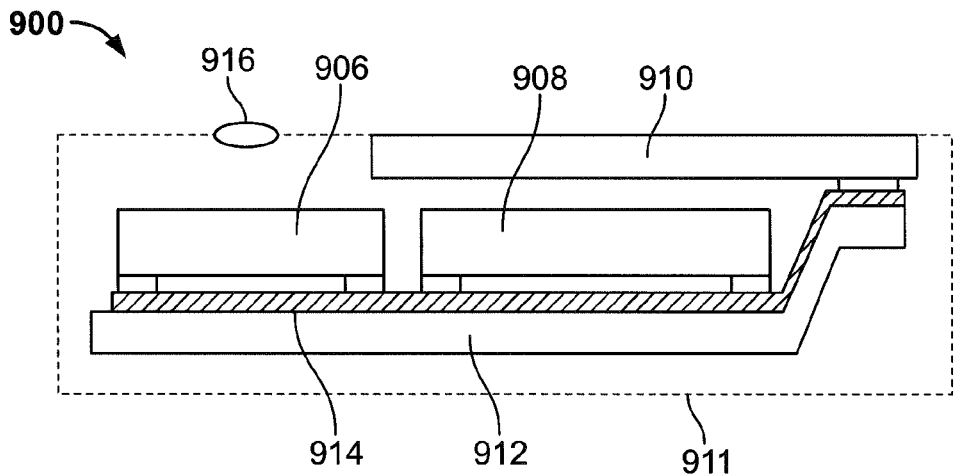
FIG. 20 is a schematic depiction of a system according to one embodiment of the disclosure.

The microelectronic packages and assemblies described above can be utilized in construction of diverse electronic systems, as shown in FIG. 20. For example, a system 900 in accordance with a further embodiment of the disclosure includes a microelectronic package or assembly 906 as described above in conjunction with other electronic components 908 and 910. In the example depicted, component 908 is a semiconductor chip whereas component 910 is a display screen, but any other components can be used. Of course, although only two additional components are depicted in FIG. 20 for clarity of illustration, the system may include any number of such components. The microelectronic package or assembly 906 may be any of the packages or assemblies described above. In a further variant, any number of such microelectronic packages or assemblies may be used. Microelectronic package or assembly 906 and components 908 and 910 are mounted in a common housing 911, schematically depicted in broken lines, and are electrically interconnected with one another as necessary to form the desired circuit. In the exemplary system shown, the system includes a circuit panel 912 such as a flexible printed circuit board, and the circuit panel includes numerous conductors 914, of which only one is depicted in FIG. 20, interconnecting the components with one another. However, this is merely exemplary; any suitable structure for making electrical connections can be used. The housing 911 is depicted as a portable housing of the type usable, for example, in a cellular telephone or personal digital assistant, and screen 910 is exposed at the surface of the housing. Where structure 906 includes a light sensitive element such as an imaging chip, a lens 916 or other optical device also may be provided for routing light to the structure. Again, the simplified system shown in FIG. 20 is merely exemplary; other systems, including systems commonly regarded as fixed structures, such as desktop computers, routers and the like can be made using the structures discussed above.

Although the disclosure herein has been described with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A microelectronic package, the package having a top surface and a bottom surface remote from the top surface, the package comprising:
    a stacked microelectronic unit including at least first and second vertically stacked microelectronic elements each having a front face facing the top surface and a rear face remote from the front face, wherein the front face of the first microelectronic element is adjacent the top surface, wherein the first microelectronic element overlies the front face of the second microelectronic element such that at least a portion of the front face of the second microelectronic element having at least one element contact thereon extends beyond an edge of the first microelectronic element;
    an encapsulant between the top surface and the front face of the second microelectronic element;
    at least one package terminal at the top surface, the at least one package terminal usable to connect the package to a contact of a microelectronic component external to the package; and
    a conductive structure electrically connecting the at least one package terminal to the at least one element contact at the front face of the second microelectronic element, the conductive structure including a wire bond extending from the at least one element contact, through the encapsulant and to the top surface.

2. The package of claim 1, wherein the conductive structure includes a second wire bond extending from at least one second element contact at a portion of the front face of the first microelectronic element, through the encapsulant and to the top surface, in which the second wire bond is electrically connected to the at least one package terminal.

3. The package of claim 1 further comprising:
    a substrate having a first surface and a second surface, wherein the stacked unit overlies the first surface of the substrate such that at least a portion of the first surface having at least one substrate contact thereon extends beyond an edge of the stacked microelectronic unit,
    wherein the encapsulant covers at least a portion of the first surface of the substrate, and
    wherein the conductive structure includes a second wire bond extending from the at least one substrate contact, through the encapsulant and to the top surface, in which the second wire bond is electrically connected to the at least one package terminal.

4. The package of claim 1,
    wherein the encapsulant is between the top surface and the rear face of the second microelectronic element, and
    wherein a conductive via, electrically connected to the at least one package terminal, extends from the top surface, through a portion of the encapsulant beyond an edge of the second microelectronic element, and to the bottom surface.

* * * * *